US012608847B2

(12) United States Patent
Song et al.

(10) Patent No.: US 12,608,847 B2
(45) Date of Patent: Apr. 21, 2026

(54) METHOD AND APPARATUS FOR GENERATING DESIGN BASED ON LEARNED CONDITION

(71) Applicant: DESIGNOVEL, Pohang-si (KR)

(72) Inventors: Woo Sang Song, Seoul (KR); Ki Young Shin, Seoul (KR); Jian Ri Li, Seoul (KR)

(73) Assignee: DESIGNOVEL, Pohang-si (KR)

( * ) Notice: Subject to any disclaimer, the term of this patent is extended or adjusted under 35 U.S.C. 154(b) by 240 days.

(21) Appl. No.: 18/257,301

(22) PCT Filed: Dec. 29, 2020

(86) PCT No.: PCT/KR2020/019350
§ 371 (c)(1),
(2) Date: Jun. 14, 2023

(87) PCT Pub. No.: WO2022/145525
PCT Pub. Date: Jul. 7, 2022

(65) Prior Publication Data
US 2024/0046529 A1     Feb. 8, 2024

(30) Foreign Application Priority Data

Dec. 29, 2020     (KR) ........................ 10-2020-0186866

(51) Int. Cl.
*G06T 11/00*          (2026.01)
*G06F 30/27*          (2020.01)
(Continued)

(52) U.S. Cl.
CPC .............. *G06T 11/00* (2013.01); *G06F 30/27* (2020.01); *G06F 40/279* (2020.01);
(Continued)

(58) Field of Classification Search
CPC .............. G06V 10/82; G06F 18/21–22; G06F 18/24–24765; G06N 3/0475
See application file for complete search history.

(56) References Cited

U.S. PATENT DOCUMENTS

2018/0374136 A1     12/2018  Kanii et al.
2020/0005087 A1      1/2020  Sewak
2022/0036127 A1*     2/2022  Lin ........................ G06T 11/00

FOREIGN PATENT DOCUMENTS

CN          109271537 A          1/2019
CN          110751698 A          2/2020
(Continued)

OTHER PUBLICATIONS

Xu, Tao, et al. "Attngan: Fine-grained text to image generation with attentional generative adversarial networks." Proceedings of the IEEE conference on computer vision and pattern recognition. 2018. (Year: 2018).*

(Continued)

*Primary Examiner* — Ryan Mcculley
(74) *Attorney, Agent, or Firm* — ZION IP; Byungwoong Park

(57)          ABSTRACT

The present disclosure relates to a method for generating a design based on a learned condition performed by a design generation apparatus based on a learned condition. According to an embodiment of the present disclosure, the method may comprise acquiring an image from information including images and texts; learning features of the acquired image; extracting texts from the information and matching the extracted texts with the learned features of the image; learning a condition for a design to be generated based on the image through the matching; receiving texts inputted by a user for design image generation; identifying a condition
(Continued)

corresponding to the user's texts; and generating a design image based on the identified condition.

3 Claims, 10 Drawing Sheets

(51) Int. Cl.

| | |
|---|---|
| *G06F 40/279* | (2020.01) |
| *G06N 3/0475* | (2023.01) |
| *G06T 3/40* | (2006.01) |
| *G06V 10/40* | (2022.01) |
| *G06V 10/74* | (2022.01) |

(52) U.S. Cl.

CPC ............. *G06N 3/0475* (2023.01); *G06T 3/40* (2013.01); *G06V 10/40* (2022.01); *G06V 10/74* (2022.01)

(56) References Cited

FOREIGN PATENT DOCUMENTS

| | | | |
|---|---|---|---|
| CN | 110866958 | A | 3/2020 |
| CN | 111260740 | A | 6/2020 |
| CN | 111325660 | A | 6/2020 |
| CN | 111968193 | A | 11/2020 |
| EP | 3754587 | A1 | 12/2020 |
| JP | 5266144 | A | 10/1993 |
| JP | 2000-032257 | A | 1/2000 |
| JP | 2017098760 | A | 6/2017 |
| JP | 2019156522 | A | 9/2019 |
| JP | 2020154844 | A | 9/2020 |
| KR | 20190064129 | A | 6/2019 |
| KR | 10-2019-0121045 | A | 10/2019 |
| KR | 20190128143 | A | 11/2019 |
| KR | 10-2020-0084425 | A | 7/2020 |
| KR | 10-2020-0092453 | A | 8/2020 |
| KR | 102189373 | B1 | 12/2020 |
| WO | 2017098760 | A1 | 6/2017 |
| WO | 2019005562 | A1 | 1/2019 |
| WO | 2019156522 | A1 | 8/2019 |
| WO | 2020141907 | A1 | 7/2020 |

OTHER PUBLICATIONS

Li, Bowen, et al. "Controllable text-to-image generation." Advances in neural information processing systems 32 (2019). (Year: 2019).*

Office Action of KIPO for Korean application No. 10-2022-0141358, issued on Sep. 26, 2023.

Office Action of KIPO for Korean application No. 10-2022-0161953, issued on Jul. 31, 2023.

Office Action of KIPO for Korean application No. 10-2022-0163201, issued on Jul. 31, 2023.

Office Action of CNIPA for Chinese application No. 202080108265, issued on Dec. 8, 2023.

Office Action of JPO for Japanese application No. 2023539295, issued on Nov. 29, 2023.

Supplementary European Search Report for PCT/KR2020019350, dated Mar. 18, 2024.

Cheng Yu Yu Cheng@Microsoft Com et al: "Sequential Attention GAN for Interactive Image Editing", Proceedings of the 13th ACM SIGPLAN International Symposium on Haskell, Oct. 12, 2020 (Oct. 12, 2020), pp. 4383-4391.

He Huang et al: "An Introduction to Image Synthesis with Generative Adversarial Nets", Mar. 12, 2018 (Mar. 12, 2018).

Shizhan Zhu et al: "Be Your Own Prada: Fashion Synthesis with Structural Coherence" arxiv.org, Cornell University Library, Oct. 19, 2017 (Oct. 19, 2017).

Sbai Othman et al: "DesIGN: Design Inspiration from Generative Networks", Jan. 23, 2019 (Jan. 23, 2019), Springer International Publishing, XP047645899, pp. 37-44.

* cited by examiner

105

DESIGN GENERATION S/W

IMAGE ACQUISITION MODULE    115

TEXT RECOGNITION MODULE    125

IMAGE-TEXT
MATCHING MODULE    135

DESIGN GENERATION MODULE    145

RESOLUTION
CONVERSION MODULE    155

METHOD AND APPARATUS FOR GENERATING DESIGN BASED ON LEARNED CONDITION

TECHNICAL FIELD

The present disclosure relates to a method and an apparatus for generating a design based on learned conditions. More particularly, it relates to a method and an apparatus for generating a design based on conditions obtained by learning acquired images and texts matched with the images.

BACKGROUND ART

In the fashion market, the proportion of so called 'fast fashion' or 'specialty retailer of private label apparel' brands has become high and this leads to shortening the period of production and consumption of a fashion design. Such fast fashion brands have a mass production system, a global distribution network and numerous designers. Based on them, they apply trendy concepts to designs and provide consumers with opportunities for purchasing trendy items at lower costs.

However, such a system for production and sale of fast fashion brands causes excessive competition in the fashion industry and creates high barriers to entry for start-ups.

To resolve such problems, technologies for generating design images based on texts are being disclosed, according to which a large quantity of images may automatically be generated by inputting only texts. By using such technologies, general users, as well as designers may generate design images by inputting only texts.

In order to commercialize images generated by the disclosed technologies, a technology for generating a high-resolution design is additionally required. A technology for generating a design reflecting rapidly changing fashion trends is required.

DETAILED DESCRIPTION OF THE INVENTION

Technical Problem

An aspect of the present disclosure is to provide a method and an apparatus for generating conditions for an automatic generation of a design by learning acquired images and texts matched with the images. Specifically, the aspect of the present disclosure is to provide a method and an apparatus for automatically generating a design by learning features expressed by the texts matched with the images and based on trends of information from the texts.

Another aspect of the present disclosure is to provide a method and an apparatus for automatically generating a design in response to an input of texts corresponding to the generated conditions. Specifically, the other aspect of the present disclosure is to provide a method and an apparatus for recognizing a selection of a product category and texts inputted by a user as a condition for a design generation and generating a design based on the condition. More particularly, it is to provide a method and an apparatus for interpreting the inputted texts as detailed features of the selected product category and generating a design reflecting the features of the product in the category.

Still another aspect of the present disclosure is to provide a method and an apparatus for raising a resolution of a design generated based on inputted texts. Specifically, it is to provide a method and an apparatus for maximizing a resolution of a design image in consideration of a feature-based loss, not a pixel-based loss, of an original image and a generated design image.

Technological aspects of the present disclosure are not limited to the aforementioned aspects and other technological aspects, which are not described above, would be clearly understood by a person with ordinary skill in the art based on the following description.

Technical Solution

To this end, a method for generating a design based on a learned condition may be performed by an apparatus for generating a design based on a learned condition. The method may comprise: acquiring an image from information including images and texts; learning features of the acquired image; extracting texts from the information and matching the extracted texts with the learned features of the image; learning a condition for a design to be generated based on the image through the matching; receiving texts inputted by a user for design image generation; identifying a condition corresponding to the user's texts; and generating a design image based on the identified condition.

According to an embodiment, the method may further comprise converting a resolution of the generated design image and generating a final design image through the resolution conversion. Converting a resolution of the generated design image may comprise extracting features of the generated design image, comparing the learned features of the image with the extracted features of the generated design image, and converting a resolution of the generated design image based on information regarding difference values from a comparison result.

According to an embodiment, learning a condition for a design to be generated based on the image may comprise learning texts, among the extracted texts, corresponding to the learned features of the image, as the condition through the matching and determining the learned texts, as the condition, as a category of a product including the features of the image.

According to an embodiment, identifying a condition corresponding the user's texts may comprise vectorizing the user's texts, generating a vector value of the user's texts as a result of the vectorization, determining whether the vector value is matched with the category and, when the vector value is matched with the category, identifying the category and the vector value as the condition.

According to an embodiment, identifying a condition corresponding the user's texts may comprise extracting a converted vector value matched with the category by applying a style variable to the category and the vector value and identifying the converted vector value and the category as the condition when the vector value is not matched with the category.

Effects of the Invention

An embodiment of the present disclosure has an advantage of generating a design image corresponding to a user's intention based on words inputted by the user even when every user uses different terms regarding a product design.

Another embodiment of the present disclosure has an advantage of providing a user with a design image reflecting the latest trend information. That is, the embodiment has an advantage of generating a design image reflecting the latest trend by applying the latest trend, which is difficult for the user to detect, to a design image generation model and interpreting texts inputted by the user based on the latest trend.

Still another embodiment of the present disclosure has an advantage of reducing the operation quantity for a design image generation by limiting subjects to be generated using a category and inputted texts.

Still another embodiment of the present disclosure has an advantage of increasing the efficiency in productization of a design by increasing a resolution of a generated design image.

Effects of the present disclosure are not limited to the aforementioned ones. Other effects, which are not described above, would be clearly understood by a person with ordinary skill in the art based on the following description.

MODE FOR IMPLEMENTING THE INVENTION

Figure 1:
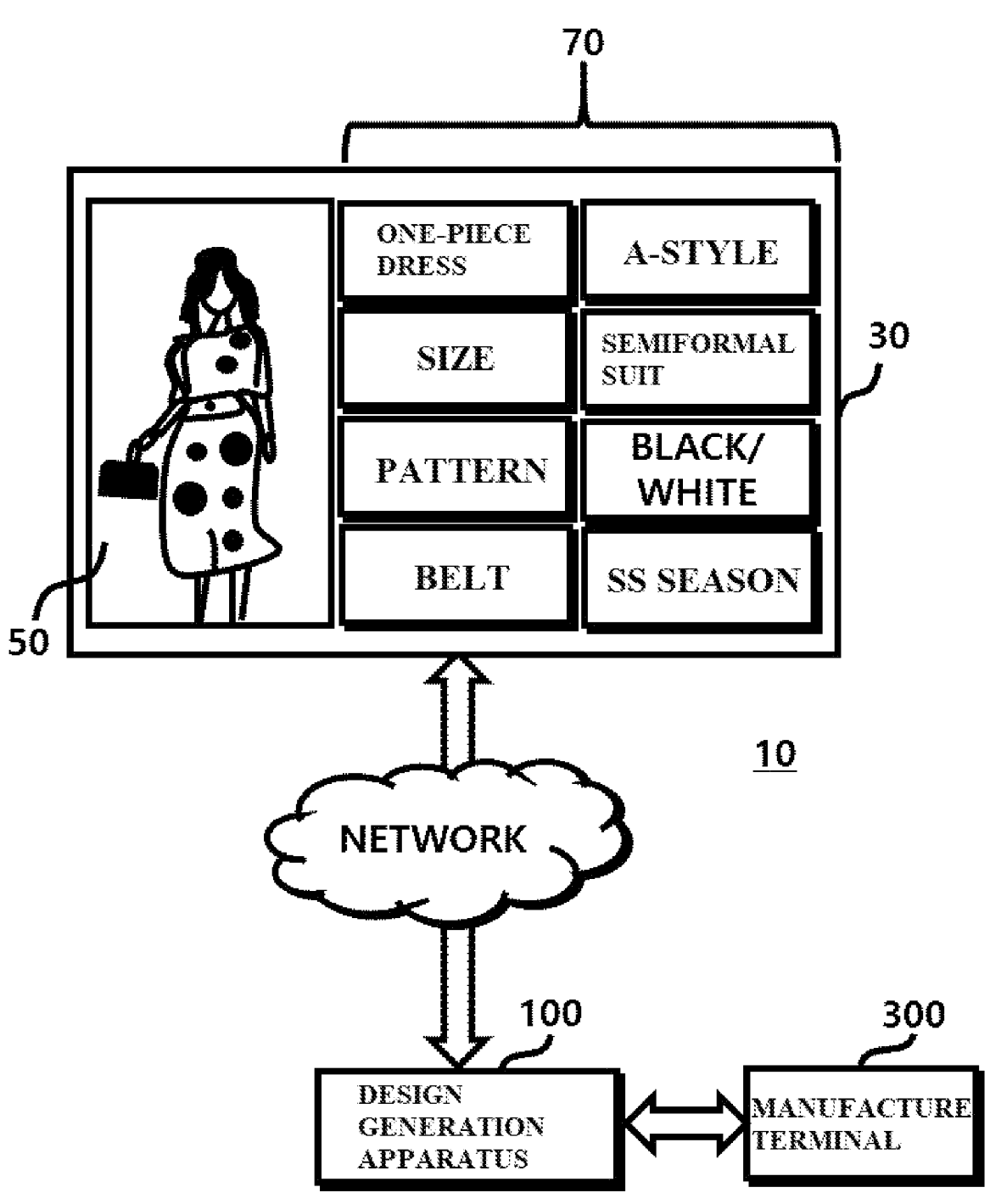
FIG. 1 is an example of a system for generating a design based on learned conditions according to an embodiment of the present disclosure.

Hereinafter, some embodiments of the present disclosure will be described in detail with reference to the accompanying drawings. Advantages and characteristics of the present disclosure and a method to achieve them will be clear by referring to the accompanying drawings and the below described embodiments. However, the present disclosure is not limited to the below disclosed embodiments, but may be implemented in various types different from each other. The embodiments are provided only for completing the present disclosure and for completely teaching the scope of the present disclosure to a person with ordinary knowledge in the art to which the present disclosure pertains. The present disclosure is defined only by the scope of the claims. With regard to the reference numerals of the components of the respective drawings, it should be noted that the same reference numerals are assigned to the same components.

If there is no other definition, all the terms used in this specification (including technological and scientific terms) have meanings that can be commonly understood by persons with ordinary skill in the art to which the present disclosure pertains. In addition, generally used terms defined in dictionaries shall not be ideally or excessively interpreted if they are not clearly and particularly defined such. The terms used in this specification are to explain the embodiments, but not to limit the present disclosure. In this specification, a term in a singular form may also mean a term in a plural form as long as there is no particular indication.

In this specification, a system for generating a design based on a learned condition, an apparatus for generating a design based on a learned condition and a method for generating a design based on a learned condition may respectively be abbreviated as a design generation system, a design generation apparatus, and a design generation method.

In this specification, images may comprise photographs, pictures and video contents, and texts may comprise a letter element such as characters, morphemes, words, and sentences and elements that can convey meanings, such as numbers, marks, etc. as well.

Figure 2:
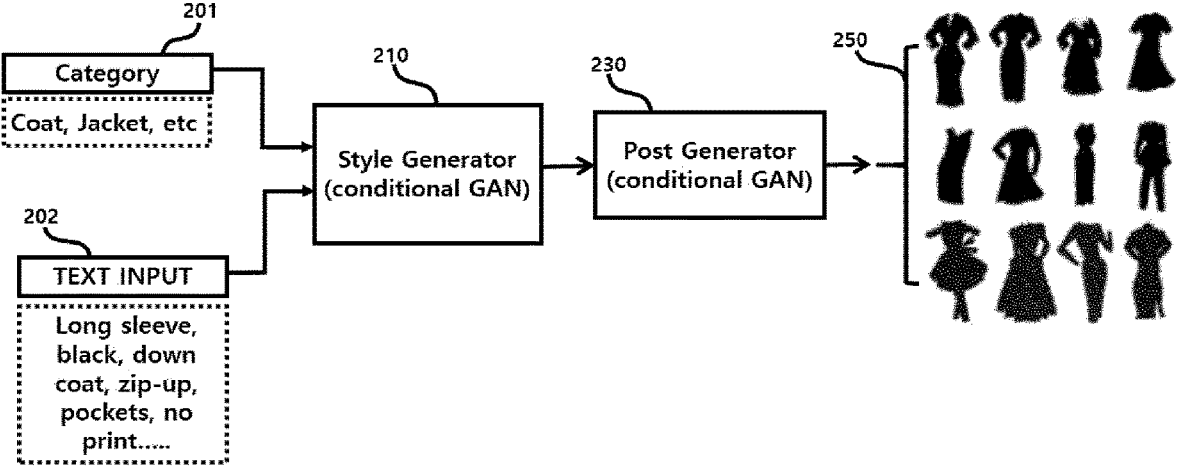
FIG. 2 is a conceptual diagram illustrating a process for a design generation based on learned conditions, to which several embodiments of the present disclosure refer.

FIG. 1 is an example of a system for generating a design based on learned conditions according to an embodiment of the present disclosure. FIG. 2 is a conceptual diagram illustrating a process for a design generation based on learned conditions, to which several embodiments of the present disclosure refer.

Referring to FIG. 1, a design generation system 10 may comprise a design generation apparatus 100, a manufacture terminal 300 and a plurality of external terminals to provide information (30) through a network.

The design generation apparatus 100, the manufacture terminal 300 and the plurality of external terminals are computing apparatuses, which can mutually exchange data through the network. The design generation apparatus 100 may access the information 30 including an image 50 and texts 70 through the network.

According to an embodiment, the design generation apparatus 100 may crawl, scrap and/or parse multitudinous pages on the Web through the network and classify, identify, extract, and process the information 30 included in the pages.

In particular, according to an embodiment of the present disclosure, the design generation apparatus 100 may acquire the image 50 and extract the texts 70 included in the information 30. The pages may comprise at least one of pages of blogs, SNSs, and internal shopping malls.

According to an embodiment, the design generation apparatus 100 may learn features of the acquired image 50 through an artificial neural network. For example, when the image 50 is a fashion design image, the design generation apparatus 100 may perform classification based on categories of clothing, based on shapes of at least parts of clothing, based on patterns of clothing, and based on textures of clothing by learning features of images acquired from multitudinous pages.

According to an embodiment, the design generation apparatus 100 may also learn the extracted texts 70. In particular, the design generation apparatus 100 may learn analyses of the extracted texts 70 in units of morpheme, word, and sentence and relations between the texts in the units. For example, The design generation apparatus 100 may extract texts, such as one-piece dress, dot, pattern, belt, wrap dress, semiformal suit, black/white, SS season, etc. The design generation apparatus 100 may classify the texts by unit, for example, by word unit or by morpheme unit and perform an embedding with respect to them.

According to an embodiment, the design generation apparatus 100 may match the acquired image 50 with the texts 70 and make a pair. In particular, the design generation apparatus 100 may learn a matching relation between the image 50 and the texts 70 based on the result of learning about the features of the image 50 and vector values extracted from the embedding of the texts 70. For example, the design generation apparatus 100 may identify a design element of a shape of a one-piece dress from among clothes based on the learning about feature points extracted from the image 50 of clothing and mutual relations between the feature points and match the image 50 with a text "one-piece dress" from among the texts 70 extracted from the pages.

According to an embodiment, the design generation apparatus 100 may learn a condition for generating a design. A condition for generating a design means a condition restricting a scope of designs to be generated when the design generation apparatus 100 generates designs by receiving texts. The inputted texts may be a keyword for a design to be generated. For example, the texts may be a kind of clothing, such as coats, one-piece dresses, jackets, etc. When the text "one-piece dress" is inputted, designs to be generated would be limited to the kind of one-piece dress and, specifically, images including learned features matched with the text "one-piece dress" may be generated.

According to an embodiment, for the reactivity of a real time design generation and the conservation of computing resources, the learning about conditions is performed and category information, such as the kinds of clothing, colors, patterns, may be generated as conditions.

According to an embodiment, when inputting texts into the design generation apparatus 100 and selecting a category for a design generation, the design generation apparatus 100 may generate a design corresponding to the category and matched with the texts.

FIG. 2 shows an example in which a category 201 includes kinds of clothing and inputted texts 202 include the length of sleeves, a color, a specific design element, and information about a zipper, pockets, and patterns.

When the category 201 and the texts 202 are inputted into the design generation apparatus 100, a style generator 210 of the design generation apparatus 100 may generate designs under the inputted condition. For example, a design generation model based on the generative adversarial networks (GAN), in particular, the conditional GAN (cGAN) may be used for the style generator 210.

Here, the GAN, belonging to the unsupervised learning, is a model, in which a generator G for generating images and a discriminator D for evaluating generated images confront each other to mutually improve their performances. The GAN may generate new images.

Specifically, with the discriminator D trying to determine only original data to be true and the generator G generating fake data that the discriminator could not determine to be false, their performances are improved together, and finally, the discriminator becomes unable to distinguish true data from fake data. By using the cGAN, data is not randomly generated, but desired data may be generated. This is in which the cGAN is different from the GAN.

Referring again to FIG. 1, the manufacture terminal 300 is a computing apparatus in a site for receiving a design generated by the design generation apparatus 100 and manufacturing products with the design. In another example, the manufacture terminal 300 may be a terminal of an influencer who receives a generated design and promotes the design. In this case, the influencer may vary and process the received design in various ways and use it in its contents.

In order that the manufacture terminal 300 receives a generated design and directly manufactures products of the design, design elements, such as a shape, a pattern, features of each area, and their relations, need to be clear. In other words, a high-resolution design image needs to be generated and provided to the manufacture terminal 300. For this, the design generation apparatus 100 may perform a final generation process with respect to a primary generated design so as to adjust the resolution of the design image.

Referring again to FIG. 2, when a design image generated by the style generator 210 has a low resolution, a design image having a high resolution may be generated by a post generator 230. For one example, the cGAN may also be used for the post generator 230. That is, according to an embodiment of the present disclosure, a final design image 250 may be generated by using another neural network different from the style generator 210. In particular, the final design image 250 may include a set of images having priority based on the user's intention inputted in a form of a text 202. The post generator 230 may be referred to as a high-resolution converter.

The design generation system 10 according to the present disclosure is not limited to FIG. 1 or the above description.

Figure 3:
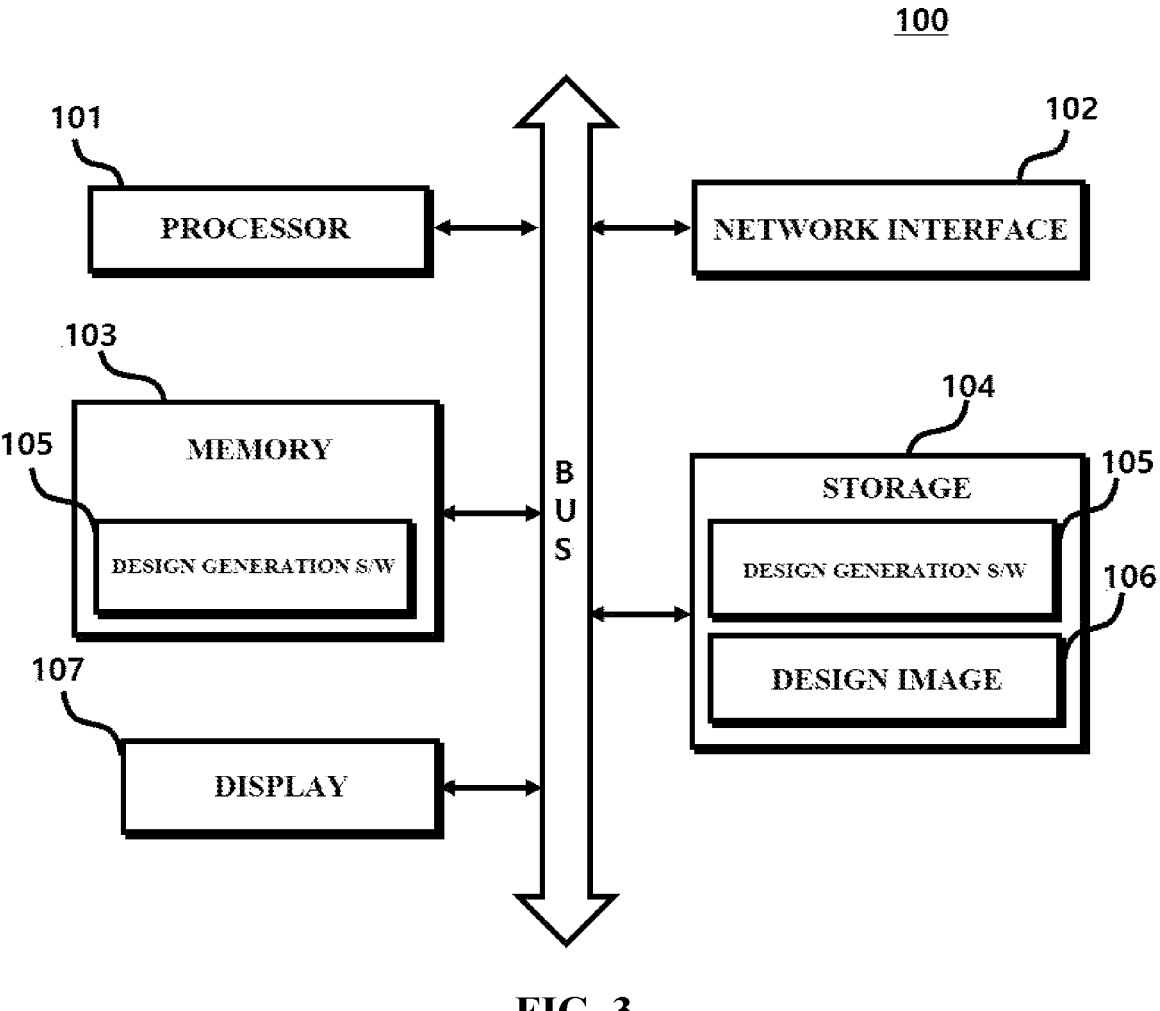
FIG. 3 is a block diagram of an apparatus for generating a design based on learned conditions according to another embodiment of the present disclosure.

Hereinafter, the function and operation of the design generation apparatus 100 will be described in detail by referring to FIG. 3. FIG. 3 is a block diagram of an apparatus for generating a design based on learned conditions according to another embodiment of the present disclosure.

Referring to FIG. 3, the design generation apparatus 100 may comprise at least one processor 101, a network interface 102 to perform wire or wireless communication with external devices, a memory 103 into which a computer program executed by the processor 101 is loaded, a storage 104 in which the computer program is stored, and a display 107.

The processor 101 controls general operations of elements of the design generation apparatus 100. The processor 101 may comprise a central processing unit (CPU), a micro processor unit (MPU), a micro controller unit (MCU), an application processor (AP), or a processor in a type well known in the art to which the present disclosure pertains. In addition, the processor 101 may perform an operation for at least one application or program in order to practice the method according to the embodiments of the present disclosure. The design generation apparatus 100 may comprise one or more processors.

The network interface 102 supports wire or wireless network communication of the design generation apparatus 100. The network interface 102 may support various communication methods other than the internet, which is a public communication network. For this, the network interface 102 may comprise a communication module well known in the art to which the present disclosure pertains. The network interface 102 may provide connection with a physical output means, such as a printer, so that a content including a user interface according to an embodiment of the present disclosure may be printed.

According to an embodiment of the present disclosure, the design generation apparatus 100 may receive information including images and texts by using the network interface 102.

The memory 103 stores various data, commands and/or information. The memory 103 may load at least one program 105 from the storage in order to practice methods according to the embodiments of the present disclosure. The memory 103 may comprise a volatile memory which is recorddecodable and fast in reading or writing. For one example, the memory 103 may comprise at least one of RAM, DRAM, and SRAM.

The storage 104 may non-temporarily store the at least one program 105 and a database 106 of generated design images. FIG. 2 shows design generation software (S/W) 105 as an example of the at least one program 105.

The storage 104 may comprise a volatile memory, such as a read only memory (ROM), an erasable programmable ROM (EPROM), an electrically erasable programmable ROM (EEPROM), or a flash memory, a hard disk, a detachable disk, or a computer-readable recording medium in any form well known in the art to which the present disclosure pertains.

According to an embodiment of the present disclosure, the design image database 106 may store information about matching relations between texts and images as well as the texts and image. The design image database 106 according to an embodiment of the present disclosure may store generated designs in order to provide them to the manufacture terminal 300. Accordingly, designs provided to the manufacture terminal 300 are not design images which have been randomly generated and stored in advance, but design images which are generated in real time in response to texts inputted into the design generation apparatus 100.

The design generation software 105 according to an embodiment of the present disclosure may comprise various modules in order to execute various functions by the design generation apparatus 100. In this specification, hereinafter, a module may mean a functional unit of software.

Figure 4:
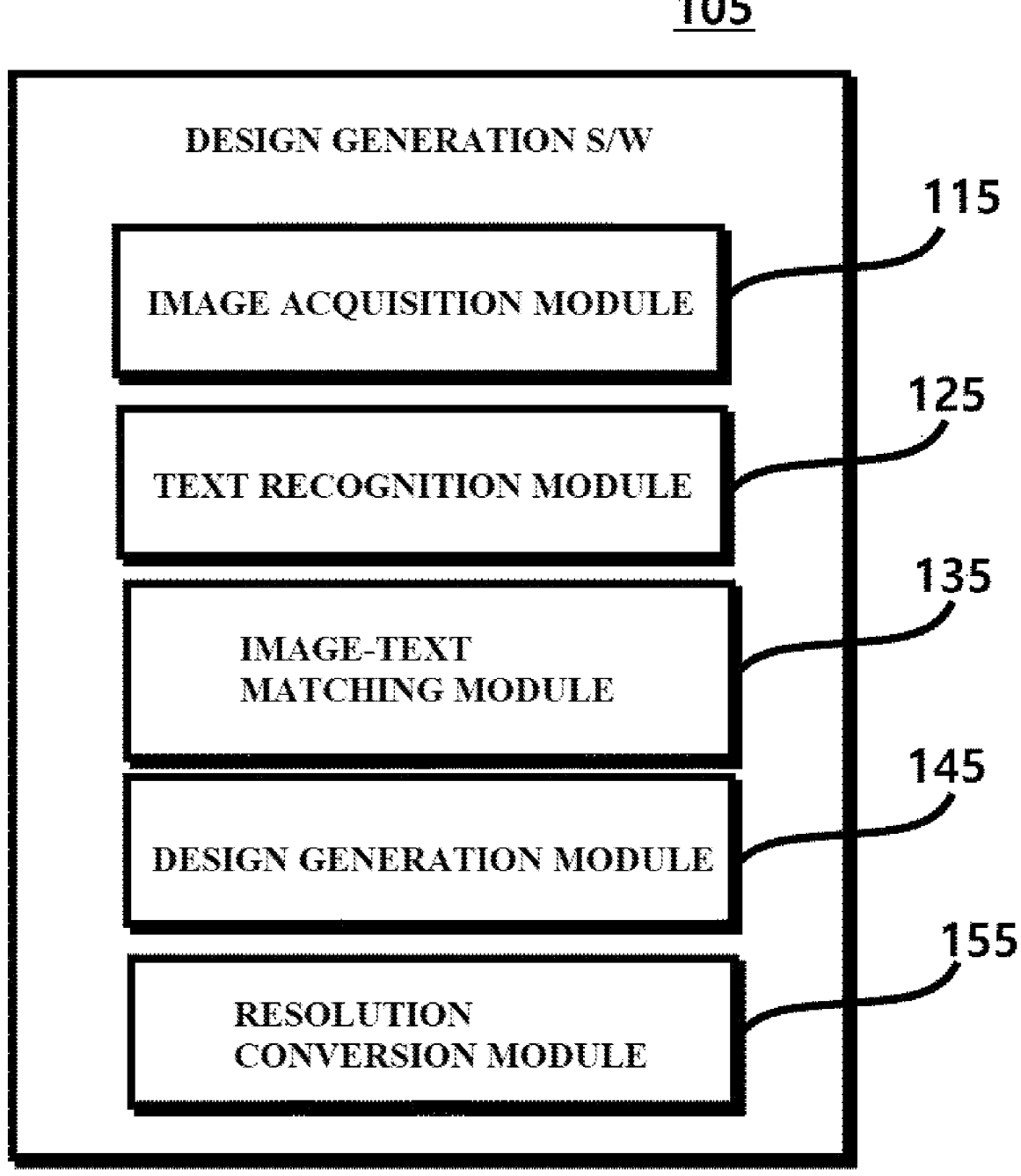
FIG. 4 is an example of a configuration of software for a design generation, to which several embodiments of the present disclosure refer.

FIG. 4 is an example of a configuration of software for a design generation, to which several embodiments of the present disclosure refer. Hereinafter, each module of the design generation software 105 will be described by referring to FIG. 4.

Referring to FIG. 4, the design generation software 105 may comprise an image acquisition module 115, a text recognition module 125, an image-text matching module 135 for matching an acquired image with an extracted text, a design generation module 145 based on the aforementioned cGAN, and a resolution conversion module 155 to perform generation of a high-resolution image for a generated image.

For example, the image acquisition module 115 may acquire the image 50 in FIG. 1 in at least one of crawling, scraping, and parsing methods and learn features of the image so that the design generation apparatus 100 may identify design elements of the acquired image, such as kinds, colors, shapes, etc. For this, the image acquisition module 115 may comprise a machine learning model.

For one example, in the learning of features, when the machine learning model is run by the processor 101 in FIG. 3, feature points may be extracted from a plurality of acquired images. The machine learning model may comprise an artificial neural network. It may comprise at least one of a convolution neural network (CNN), an auto encoder, a feedforward neural network, a radial basis function network, a kohonen self-organizing network, and a recurrent neural network (RNN).

For example, if the machine learning model comprises the convolution neural network, when the machine learning model is run by the processor 101, feature values of the image 50 of a one-piece dress of FIG. 1 are filtered and predetermined values are newly taken from among various image pixels through the convolution calculation. By repeating this operation, desired feature points may be extracted.

The feature points may be part of clothing that can be identified by the processor's 105 executing the design generation program 105. For example, the feature points may be points corresponding to the outline of the shape of the one-piece dress, the pattern of the external surface of the one-piece dress, the belt part, etc. Specifically, the feature points may be points located on lines or areas forming the shape and/or pattern of the one-piece dress.

According to an embodiment of the present disclosure, the design generation apparatus 100 may analyze the directivity and similarity of the extracted feature points and relate the feature points. That is, the design generation apparatus 100 may relate the feature points and connect them to generate lines and may identify kinds of a design subject, for example, clothing based on the generated lines.

The text recognition module 125 allows the design generation apparatus 100 to extract the texts 70 from the information 30 of FIG. 1. For example, the texts 70 are texts on webpages of shopping malls, which may include product description texts provided by a page provider and review texts of product purchasers.

The text recognition module 125 may allow the design generation apparatus 100 to extract texts, such as one-piece dress, dot, pattern, belt, A-style, semiformal suit, black/white, SS season, etc. from the product description texts and the review texts. The extracted texts may be texts commonly appearing in the product description texts and the review texts. For another example, the extracted texts may be texts respectively belonging to the product description texts and the review texts and having mutual semantic relations. In addition, the extracted texts may include words frequently exposed in relation to designs, words tagged by a person who inputs texts, appraisals of designs, or positive or negative response texts.

According to an embodiment, the text recognition module 125 may comprise a network to encode the extracted texts. The encoding network may comprise 4 layers, wherein, in lower two layers, which are for expressions in sentence units, a network is limited in boundaries between sentences and, in upper two layers, which are for expressions in document units, a network is not limited in the boundaries between sentences so as to enable the learning of the entire document. For example, the encoding network may be a language model based on the bidirectional encoder representations from transformers (BERT). The BERT is a language model, which learned languages using a corpus including 3.3 billion words by using a bidirectional transformer structure.

According to an embodiment, the text recognition module 125 may learn a document, including images and texts like the information 30 of FIG. 1 including the image and the texts, as a subject to be learned like the corpus. In this way, the conditions for a design to be generated according to an embodiment of the present disclosure may be learned through the learning of the texts 70 matched with the features of the image 50 included in the information 30. For example, the learned conditions may be texts for a category matched with an image, which is a subject of a design, a shape having a high probability to being applied to the subject of a design, or texts corresponding to a pattern. That is, the text "one-piece dress" matched with the image (50) of FIG. 1 may be learned as a category of the image 50. Also, the text "dot" may be learned as a pattern applied to the "one-piece dress", which is the category.

According to an embodiment, the text recognition module 125 may learn a function of determining, to which category a subject of a design belongs, in consideration of characteristics of a domain, to which the subject of the design belongs. For example, assuming that the subject of the design is a garment, the domain relates to the fashion industry, and the category is a kind of clothing, the design generation apparatus 100 may determine that the text "wrap dress" from among the texts 70 of FIG. 1 belongs to the category of "one-piece dress".

The design generation apparatus 100 may determine whether a vector value, obtained by vectorizing a text, is matched with a category and reflect the result in a design when they are matched with each other. When the vector value is not matched with the category, for example, a vector value of the text "hip pockets of pants" is not matched with the category of "one-piece dress", the design generation apparatus 100 may apply a converted value to the vector value to generate a converted vector value. In this case, the design generation apparatus 100 may apply a pocket design to a lower portion of a one-piece dress. The converted vector value may be generated based on a vector value of the text "one-piece dress" belonging to the category.

The image-text matching module 135 matches a feature identified by learning an acquired image with a vectorized result of the extracted texts by a language model.

For example, the design generation apparatus 100 may comprise a deep learning model in which the image-text matching module 135 combines a result of learning about features of an image by the image acquisition module 115 with an interpretation of a text learned by the text recognition module 125. As such, the design generation apparatus 100 may generate a design condition of a subject to be generated. The generated condition may be referred to as a condition set or a condition part.

Here, the generated condition may form a category. If the generated condition is "one-piece dress", the image-text matching module 135 may reflect the text "one-piece dress" in the categories and apply, to the one-piece dress category, image features and/or texts embedding information relating to various one-piece dresses, such as shirt-dresses, T-shirt dresses, sweater dresses, wrap dresses, maxi dresses, smock dresses, skater dresses, empire dresses, etc. as conditions for a design generation.

Although the case in which the categories are conditions for a design generation is described here, the embodiments of the present disclosure are not limited to that, but texts may be reflected in a generated design as conditions.

The design generation module 145 controls the design generation apparatus 100 to generate a design reflecting an inputted text under the generated condition.

The GAN randomly generates an image based on randomly provided vectors and it has a disadvantage that it is difficult to control result images. As an improvement, a styleGAN to generate an image by using a style vector is being proposed.

From such a point of view, according to an embodiment of the present disclosure, the design generation apparatus 100 may generate a design satisfying constraint conditions in response to conditional inputs. That is, the design generation apparatus 100 according to the present disclosure allows generating a design to which a user's intention is sufficiently applied by controlling a subject design to be generated to reflect a style.

For this, the text recognition module 125 may connect networks such that a design image may be generated by using an encoded result of the aforementioned encoding network as a style vector. The style vector is a result of a text vectorization by the aforementioned language model and an element to put a style on a subject image to be generated.

According to an embodiment of the present disclosure, for the image-text matching module 135, the 512-dimension vector may be used as the style vector, 8 fully-connected (FC) layers may be used as a mapping network, and 18 CNN layers may be used as a design image generation network.

When the "one-piece dress", which is a kind of clothing, is determined as a category, the design generation apparatus 100 may recognize an inputted text as a keyword relating to a one-piece dress and generate a design by reflecting a style vector value based on the inputted text in a design image of a one-piece dress. For example, in the design generation apparatus 100, when the category "one-piece dress" is selected, a keyword relating to the color "black" and a keyword relating to the pattern "dot" are inputted as texts, a design image of a one-piece dress having dot patterns by reflecting the style vector value of the inputted texts.

Meanwhile, according to an embodiment of the present disclosure, the text recognition module 125 may make the design generation apparatus 100 generate a design including multiple colors, not one color. Referring to the above example, when texts "black", "dot", and "white" are inputted, the text recognition module 125 may generate a style vector by considering the relation between the texts "black" and "dot" and the input order of "white", and the image-text matching module 135 may apply the generated style vector to the design category as a condition, and the design generation module 145 may generate a design image of a white one-piece dress having a black dot pattern.

The resolution conversion module 155 may perform a generation of a high-resolution image with respect to a generated image. The resolution conversion module 155 may support a function of the post generator 230 of FIG. 2.

According to an embodiment of the present disclosure, the resolution conversion module 155 may comprise an image resolution enhancement network to generate a high-resolution image with respect to a result of the cGAN. The image resolution enhancement network may be, for example, a super-resolution generative adversarial network (SRGAN).

An image generation generally requires an enormous computing power. For this reason, when using a deep learning network, the image resolution is restricted to 256× 256 pixels or 512×512 pixels in order to reduce the operation quantity. However, since detail verification is required in the fashion field, if a result with a low resolution is generated, it would not be advantageous to use the GAN in the fashion field. In order to resolve such a problem, according to an embodiment of the present disclosure, the design generation apparatus 100 may convert a result of the cGAN generation network into a high-resolution image by using the SRGAN of the resolution conversion module 144.

Specifically, the design generation apparatus 100 may generate a design image by reflecting similarity based on extracted features, not by comparison between an original image and a design image to be generated based on pixels using an image resolution enhancement network such as the SRGAN included in the resolution conversion module 155. For example, the resolution conversion module 155 may generate a high resolution design image very similar to an original image, even to a person's naked eyes, by using a learning function based on the similarity between encoded results using the VGGNET, not based on the similarity between pixels.

Referring again to FIG. 3, the design generation apparatus 100 may comprise a display 107. The display 107 may comprise a display 107 widely known in the art to which the present disclosure pertains. The display 107 may show a design image generated by the design generation apparatus 100 and/or an image converted to have a high resolution. When the display 107 comprises a touch screen, the display 107 may function not only as an output part but also as an input part. In this case, the design generation apparatus 100 may provide an interface for the category selection and the text input through the display 107.

Figure 5:
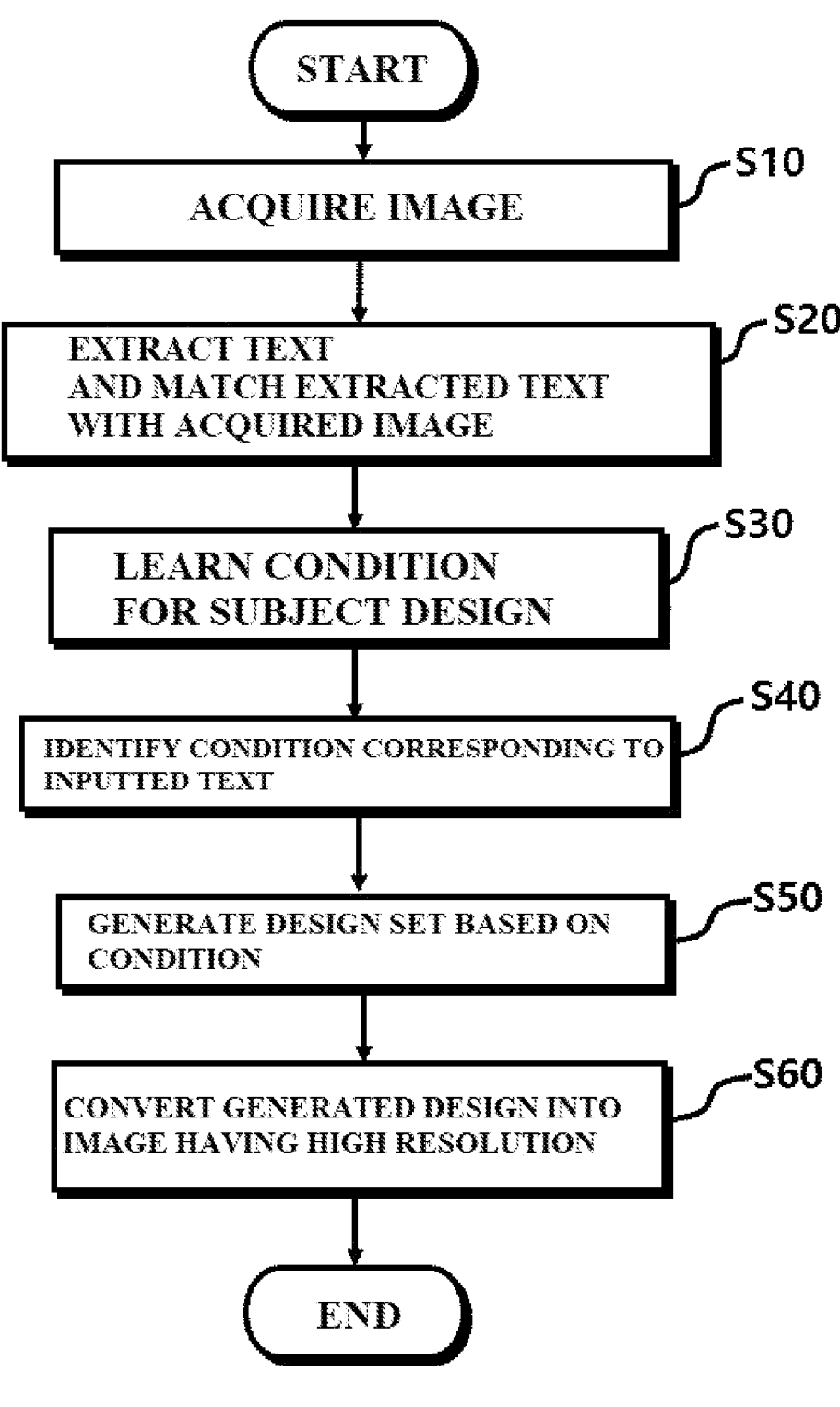
FIG. 5 is a flow diagram of a method for generating a design based on learned conditions according to still another embodiment of the present disclosure.
Figure 6:
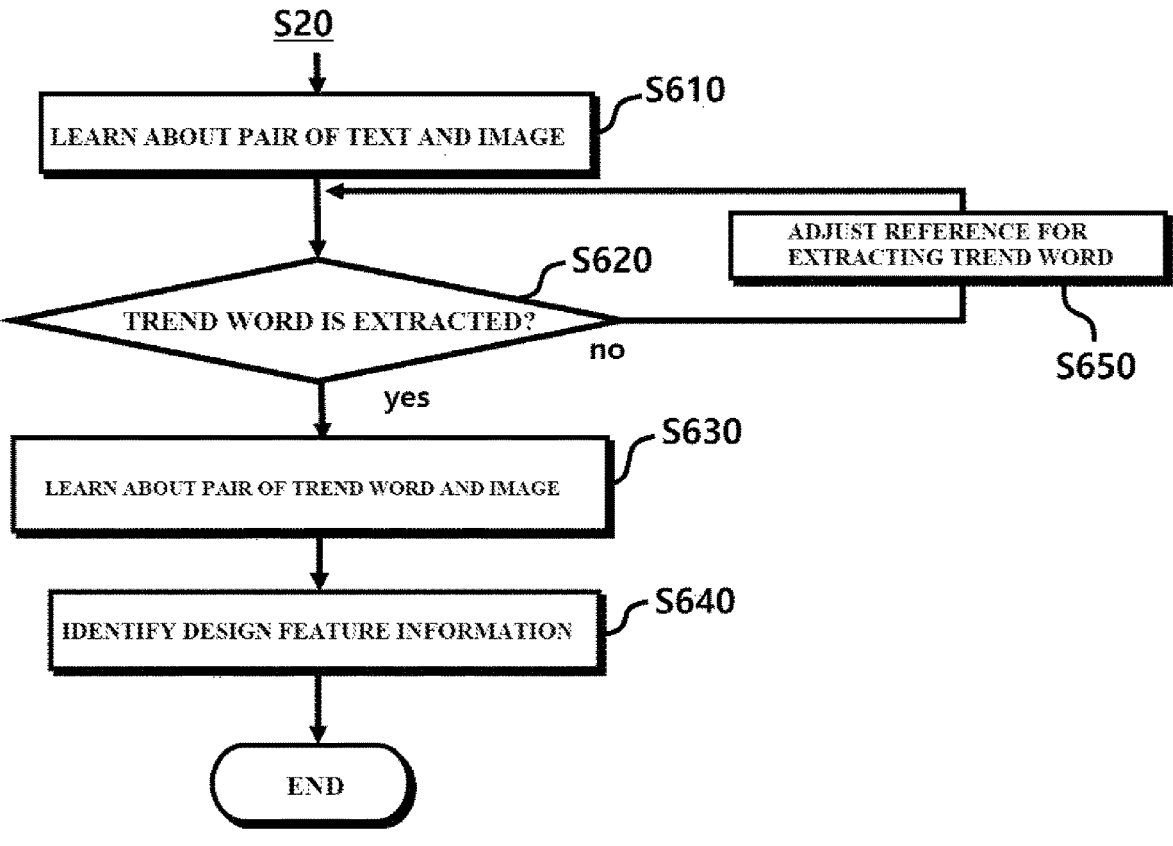
FIG. 6 is flow diagram of a method of matching acquired images with extracted texts according to still another embodiment of the present disclosure.

FIG. 5 is a flow diagram of a method for generating a design based on learned conditions according to still another embodiment of the present disclosure. FIG. 6 is flow diagram of a method of matching acquired images with extracted texts according to still another embodiment of the present disclosure.

All the steps referred to in FIG. 5 and FIG. 6 are executed by the design generation apparatus 100. Specifically, they may be executed by the processor's 101 operating the design generation program 105.

Referring to FIG. 5, the design generation apparatus 100 may acquire an image (S10). The acquired image may be an image included in the information 30 as described in FIG. 1. For example, it may be an image of a fashion design product, in particular, an image of a one-piece dress.

The design generation apparatus 100 may extract a text from the information 30 through the text recognition module 125 and match the extracted text with the acquired image by using the image-text matching module 135 (S20).

Referring to FIG. 6, in matching (S20), the design generation apparatus 100 may perform learning about a pair of a text and an image (S610). The pair of a text and an image may be, for example, the pair of the text 70 and the image 50 of the information 70 in FIG. 1.

In learning (S610), a text, extracted with a great frequency regarding design features, which compose at least a part of a one-piece dress, analyzed through the learning of the image 50 of FIG. 1, may be extracted. For example, when images of one-piece dresses and a text "dot" matched with the image of one-pieces are extracted with a great frequency from among various documents learned by the design generation apparatus 100, the design generation apparatus 100 may interpret that the "dot" is a design element of the one-piece dresses. Accordingly, the text "dot" may be matched with the one-piece dress of the image 50.

According to an embodiment of the present disclosure, as a result of the learning about images acquired and texts extracted from documents, which are subjects of the crawling, scraping and/or parsing, a word having a frequency of extraction higher than a predetermined reference number of times may be identified and the word may be determined to be a trend word.

The design generation apparatus 100 may determine whether a trend word is extracted in the learning process (S610) (S620). When a trend word exists and is extracted, the design generation apparatus 100 may perform learning of a pair of the trend word and an image (S630).

For example, if multiple crawlings are performed with respect to pages including information similar to the information 30 of FIG. 1 or multiple images identical or similar to the image are acquired through parsings, this may be because there is a lot of information about one-piece dresses with dot patterns. This may be a result of the increase of the manufacture and sales of one-piece dresses with dot patterns or the increase of consumer interest thereabout, which leads to a reflection of a current trend. That is, in this case, the text "dot" may frequently appear on internet pages as descriptions of products or purchase reviews, and thus, when extracting texts, the number of extraction times of the text "dot" would be ranked higher.

In S630, the design generation apparatus 100 may learn a pair of the acquired image of the one-piece dress and the text "dot", which is the trend word, and identify a design feature, which is the dot patterns of the one-piece dress image (S640) in this process. That is, since the one-piece dress image for the text "dot" has the dot patterns, the design generation apparatus 100 may identify the dot patterns, which are a design element of the one-piece dress, as feature information as a result of the learning.

Furthermore, the design generation apparatus 100 may identify features regarding the disposition of dots, the number of dots, the area (size) of a dot, or the color of dots in the dot patterns through the learning in S630. As such, the design generation apparatus 100 may identify information of design features of the latest trends among dot patterns of one-piece dresses.

According to another embodiment, the design generation apparatus 100 may determine, as a trend word, a text having a high increase rate of extractions as well as a high number of times of extractions.

However, there may be a case when no trend word is extracted in S620. This is because a design trend leading the relevant market has not yet been formed or a term expressing a specific design has not yet been established. In such as case, the design generation apparatus 100 may adjust a reference for extracting a trend word (S650).

For one example, the design generation apparatus 100 may change a predetermined reference number of times of text extractions.

For another example, the design generation apparatus 100 may adjust a reference for extracting a trend word based on a relation between extracted texts. For example, when there are multiple texts, having a relatively high number of times of extractions, although each of the multiple texts is not frequently extracted, the design generation apparatus 100 may determine the multiple texts as trend words. Referring to the above example, when the words "dot" and "water drop" are relatively frequently extracted although the word "dot" is not frequently extracted as a pattern of a one-piece dress, the design generation apparatus 100 may determine the words "dot" and "water drop" as words expressing the same design feature and perform the learning of S630.

For still another example, the design generation apparatus 100 may adjust a reference for extracting a trend word by adjusting a schedule for extracting a trend word such that the quantity of the design generation apparatus's 100 learning about the pair of the text and the image in S610 may be increased.

The identification of the design feature information in S640 allows the design generation apparatus 100 to learn the texts expressing the design feature information as a condition for generation a design.

Referring again to FIG. 3, the design generation apparatus 100 may learn a condition for a subject design to be generated (S30). The design generation apparatus 100 may generate categories of designs through the learning of S30. For example, the design generation apparatus 100 may identify texts expressing kinds of clothing, such as one-piece dresses, jackets, pants, etc. and generate the texts as categories.

In addition, the design generation apparatus 100 may learn that detailed design classes, belonging to the kinds of clothing, belong to a category. For example, the design generation apparatus 100 may learn that the one-piece dress with dot patterns of the image 50 in FIG. 1 belongs to the category "one-piece dresses". As such, when a user selects the category "one-piece dresses" and inputs the text "dot", the design generation apparatus 100 may generate a design of a one-piece dress having the same dot patterns as those of the image 50.

The design generation apparatus 100 may identify a condition corresponding to an inputted text (S40). Referring to the above example, when the text "dot" is inputted, the design generation apparatus 100 may identify a condition for a design corresponding to the dot. That is, the design generation apparatus 100 may identify vector information for the text "dot" and the category to which the text "dot" belongs.

The design generation apparatus 100 may generate a design set based on the identified condition (S50). Here, the generated design set may be outputted through the display 107 and the disposition order of the displayed generated designs, reflecting the trend learned in S630 of FIG. 6, may be determined. The design set is a group of design images including the generated designs. The number of design images displayed on a screen may be determined depending on a display area or a predetermined user interface of the display 107.

The design generation apparatus 100 may convert the generated designs into images having high resolutions (S60). For this, the resolution conversion module 155 of FIG. 5 converts the resolutions of the generated designs based on the similarity of design feature information, not the similarity of pixels.

Figure 7:
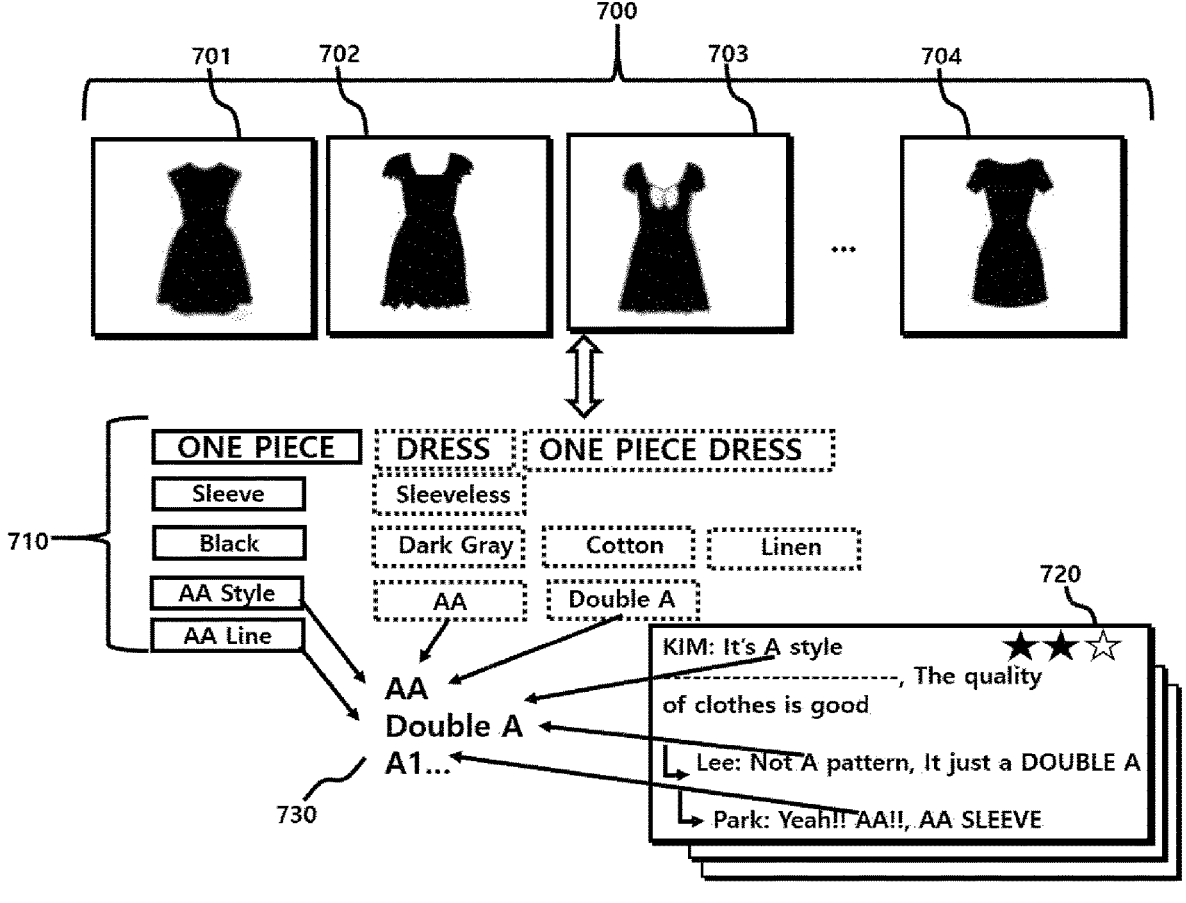
FIG. 7 is an example illustrating a method of learning pairs of images and texts matched with the images, to which several embodiments of the present disclosure refer.
Figure 8:
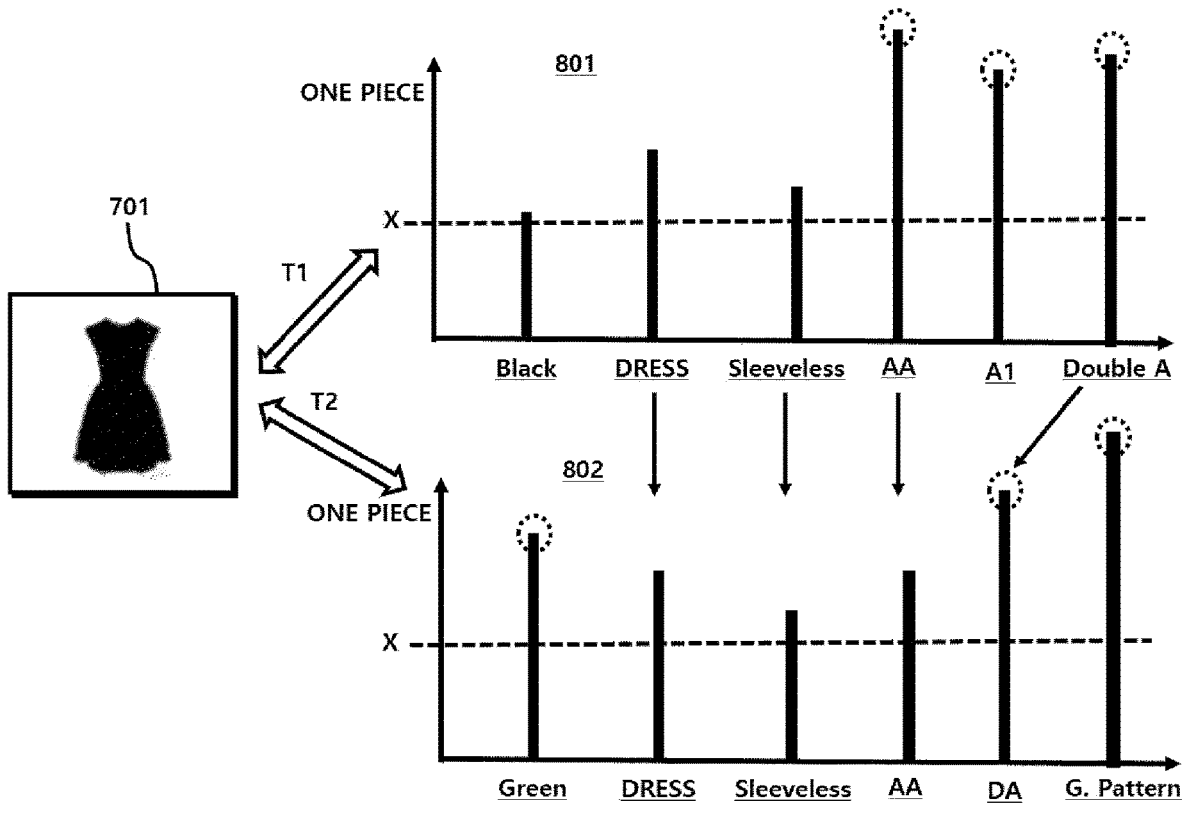
FIG. 8 is an example illustrating a process of selecting trend words, to which several embodiments of the present disclosure refer.

FIG. 7 is an example illustrating a method of learning pairs of images and texts matched with the images, to which several embodiments of the present disclosure refer. FIG. 8 is an example illustrating a process of selecting trend words, to which several embodiments of the present disclosure refer.

Referring to FIG. 7, the design generation apparatus 100 may acquire a plurality of image sets 700. The design generation apparatus 100 may acquire a plurality of images like the image of the information 30 of FIG. 1 from web pages, establish an image set 700 with the images, and determine the image set as an image learning subject for extracting features of a design.

The design generation apparatus 100 may identify features of one-piece dresses by learning the images 701, 702, 703, 704 of the image set 700.

The design generation apparatus 100 may extract a plurality of texts like the texts of the information 30 from web pages. The web pages means pages of blogs or on-line shopping malls. When there are descriptions of a product, which is a subject to be designed, the design generation apparatus 100 may extract texts from the descriptions and generate a text set 710 and when there are reviews 720 of on-line shopping malls, the design generation apparatus 100 may also extract text from the reviews 720 as well.

The design generation apparatus 100 may identify texts 730 extracted at least a predetermined reference number of times from among the texts extracted from the text set 710 and the reviews 720.

FIG. 7 shows an example in which texts such as 'one-piece', 'dress', 'one-piece dress', 'sleeve', 'sleeveless', 'black', 'dark gray', 'cotton', 'linen', 'AA style', 'AA line', etc. are extracted.

The design generation apparatus 100 may learn the text set 710 extracted from the descriptions and the reviews 720. Through the learning, the design generation apparatus 100 may confirm whether the texts, used for the information of product descriptions, are used in the reviews as well and if the texts used for the product descriptions have a high similarity to the texts used for the reviews. If so, the design generation apparatus 100 may learn these texts as a product category.

Referring to FIG. 7, it may be determined that the texts such as AA, double A, or A1 are frequently extracted or the extraction amount of these texts increases in the one-piece dress category, and thus, these texts may be determined as trend words 730. For example, these words 'AA', 'double A', and 'A1' may be design terms relating to features of one-piece designs like the word "dot".

FIG. 8 shows, through a graph 801, an exemplary case regarding the image 701 in which words 'black', 'dress', 'sleeveless', 'AA', 'A1' and 'double A' are extracted at least a predetermined reference number of times x in the one-piece dress category during a time T1. For the time T1, the words 'AA', 'A1', 'double A' are determined as trend words. FIG. 8 also shows, through a graph 802, an exemplary case regarding the image 701 in which the design generation apparatus 100 extracts the words 'green', 'dress', 'sleeveless', 'AA', 'DA', and 'G. pattern' at least the predetermined reference number of times x during a time T2. The design generation apparatus 100 determines the words 'green', 'DA', and 'G. pattern' as trend words for the time T2.

During the change from the time T1 to the time T2, the text 'black' is excluded from high-ranked texts in the number of extraction times and the text 'green' is added. The extraction amount of the text 'AA' is reduced and the text 'A1' is excluded. This may mean that the terms 'AA' and 'A1' are not consistently used. In addition, the word 'double A' being changed to the word 'DA' may show that the relevant design term used by users is being changed. The design generation apparatus 100 may confirm the change in trend for the one-piece dress category regarding the image 701 by learning such changes in the extracted texts.

In addition, the design generation apparatus 100 may detect a change in trend for the one-piece category regarding the image 701 through the newly extracted texts 'green' and 'G. pattern'. For example, the change of trend colors, because of the change of season during the change from the time T1 to the time T2, may be reflected. The design generation apparatus 100 may learn such changes in trend based on the change of the extracted texts.

Figure 9:
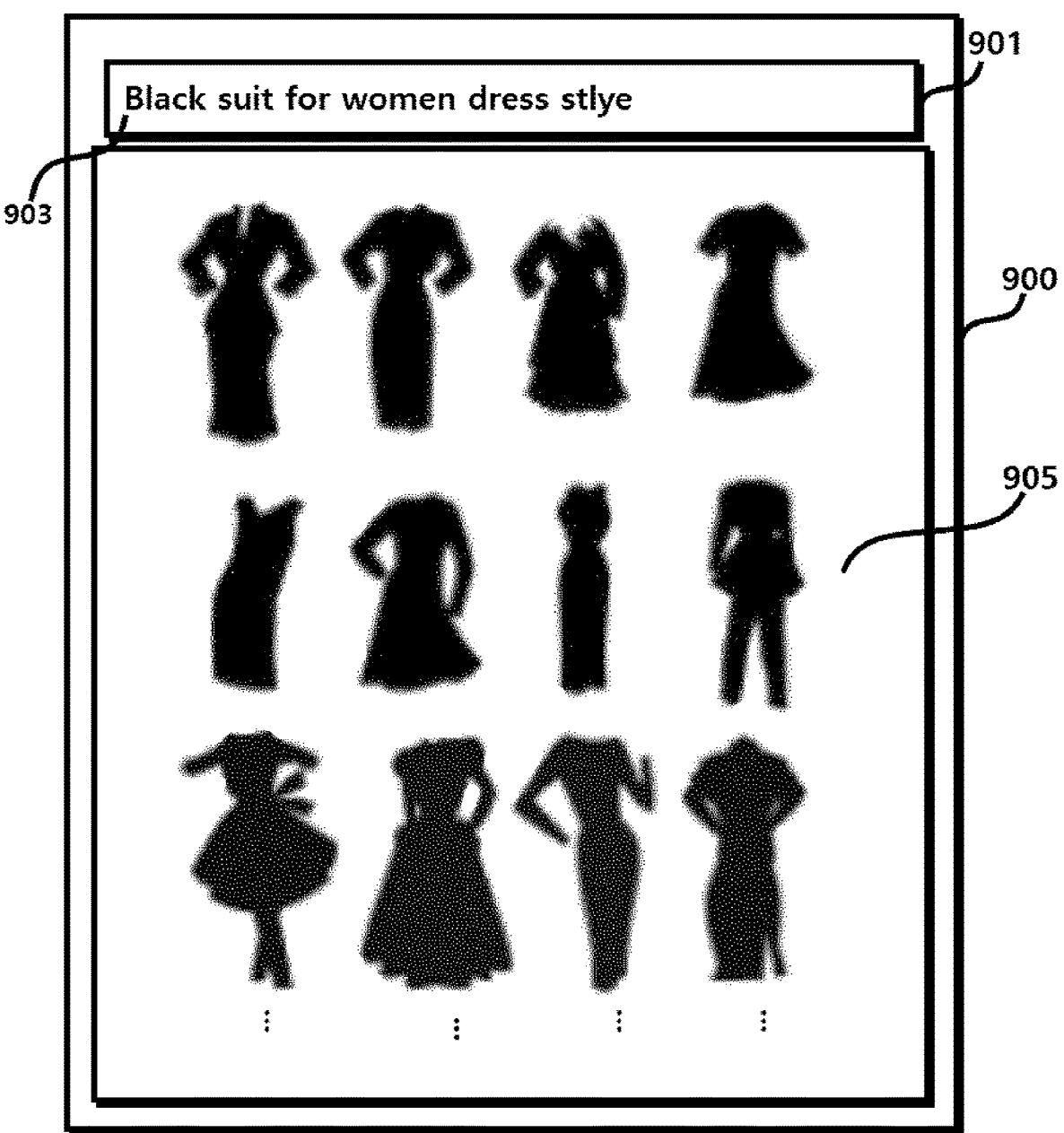
FIG. 9 is an example of an interface for generating designs in response to inputted texts, to which several embodiments of the present disclosure refer.

FIG. 9 is an example of an interface for generating designs in response to inputted texts, to which several embodiments of the present disclosure refer.

Referring to FIG. 9, the design generation apparatus 100 may generate an interface 900 and output it through the display 107 of FIG. 3. In FIG. 9, the interface 900 may comprise a text input window 903 and a design image output part 905.

The design generation apparatus 100 may generate design images 905 reflecting texts inputted in the text input window 903 as conditions.

Figure 10:
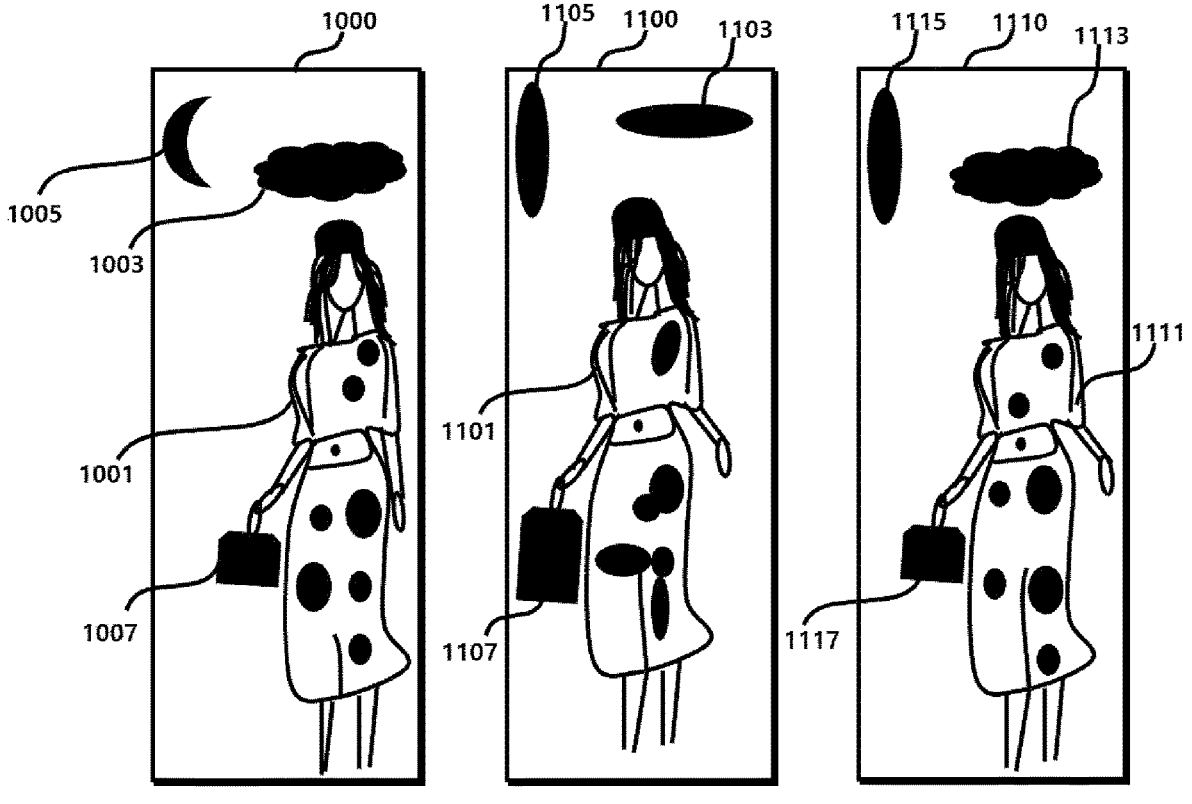
FIG. 10 is an example of high-resolution design images generated by a post generator, to which several embodiments of the present disclosure refer.

FIG. 10 is an example of high-revolution design images generated by a post generator, to which several embodiments of the present disclosure refer.

FIG. 10 shows as examples an original image 1000, a generated design image 1100 and a design image with a converted resolution 1110.

Referring to FIG. 10, the original image 1000 may comprise as components background 1 1003, background 2 1005, design element 1 1001 and design element 2 1007. The generated design image 1100 may comprise background 1 1103, background 1 105, design element 1 1101 and design element 2 1107.

The design image with a converted resolution 1110 may comprise background 1 1113, background 1 115, design element 1 1111 and design element 2 1117.

The design generation apparatus 100 may generate the design image 1100 by learning the original image 1000. Here, as shown in the design image 1100, background 1 1103 and background 2 1105 may be distorted (smoothened) due to the resolution issue and design element 1 1101 and design element 2 1107 are also different from the original elements.

Since the generated design image 1100 has been generated based on the original image 1000, it may be different from the original image 1000 in its design. However, regarding the resolution, the design image 1100 may not be considered by the user as an originally generated image, but may be considered as an image generated by a simple image processing.

Referring to the design image with a converted resolution 1110, although there is a problem due to the resolution like background 2 1115, the design image with a converted resolution 1110 has a resolution similar to that of the original image 1000 even though it is generated from the original image 1000. The design generation apparatus 100 may generate the design image with a converted resolution 1110 by performing learning based on a comparison of the design features of the original image 1000, not a comparison of pixels thereof by using the image conversion module 155.

The methods according to the embodiments of the present disclosure described referring to the drawings may be executed by the computer program implemented by computer-readable codes. The computer program may be transmitted from a first computing apparatus to a second computing apparatus through a network such as an internet, installed in the second computing apparatus, and used in the second computing apparatus. The first computing apparatus and the second computing apparatus may comprise both stationary computing apparatuses, such as server apparatuses, desktop personal computers, and mobile computing apparatuses, such as notebook computers, smart phones, tablet personal computers.

Although the embodiments of the present disclosure are described with reference to the drawings, a person with ordinary skill in the art, to which the present disclosure pertains, would understand that the present disclosure can be implemented in other specific ways without changing its technological concept or essential characteristics. Therefore, it should be understood that the embodiments described above are provided for illustrative purpose, not limitative purpose.

What is claimed is:

1. A computer-implemented method of training neural networks for generating a design based on a trained condition, wherein a computer processor and one or more memory devices communicatively coupled to the computer processor, and the one or more memory devices stores instructions operable when executed by the processor to perform the steps of:

collecting, by the computer processor, a digital image data from information including images and texts;

training a first neural network, by the computer processor, with features of the collected digital image data;

extracting, by the computer processor, texts from the information;

matching, by the computer processor, the extracted texts with the trained features of the digital image data;

training, by the computer processor, the first neural network with a condition for a design to be generated based on the digital image data through the matching;

receiving texts, by the computer processor, for design image generation;

identifying, by the computer processor, a condition corresponding to the received texts;

generating, by the computer processor, a design image based on the identified condition;

converting, by the computer processor and via a second neural network, a resolution of the generated design image; and generating, by the computer processor, a final design image through the resolution conversion, wherein converting the resolution of the generated design image comprises:

extracting, by the computer processor, features of the generated design image;

comparing, by the computer processor, the trained features of the digital image data with the extracted features of the generated design image; and converting, by the computer processor and via the second neural network, the resolution of the generated design image based on information regarding difference values from a comparison result, wherein training the first neural network with the condition for the design to be generated based on the digital image data comprises:

training, by the computer processor, the first neural network with texts, among the extracted texts, corresponding to the trained features of the digital image data as the condition through the matching; and determining, by the computer processor, the trained texts, as the condition, as a category of a product including the features of the digital image data, wherein identifying the condition corresponding the received texts comprises:

vectorizing, by the computer processor, the received texts;

generating, by the computer processor, a vector value of the received texts as a result of the vectorization;

determining, by the computer processor, whether the vector value is matched with the category; and when the vector value is matched with the category, identifying, by the computer processor, the category and the vector value as the condition, wherein identifying the condition corresponding the received texts further comprises:

extracting, by the computer processor, a converted vector value matched with the category by applying a style variable to the category and the vector value; and identifying, by the computer processor, the converted vector value and the category as the condition when the vector value is not matched with the category, wherein the second neural network is super-resolution generative adversarial network (SRGAN), and wherein matching the extracted texts with the trained features of the digital image data further comprises:

training, by the computer processor, the first neural network with at least one pair of a text and a corresponding image of the text;

adjusting, by the computer processor, a predetermined condition for a trend word;

determining, by the computer processor, a text extracted with the predetermined condition as a trend word;

training, by the computer processor, the first neural network with at least one pair of the determined trend word and a corresponding image of the determined trend word; and identifying, by the computer processor and via the first neural network, a design feature information corresponding with the trend word.

2. The method of claim 1, wherein the predetermined condition comprises:

a predetermined increase rate of extractions; and a predetermined number of times of extractions.

3. The method of claim 1, wherein the trend word includes a combination of words.

* * * * *